United States Patent
Lee et al.

(10) Patent No.: US 6,271,057 B1
(45) Date of Patent: Aug. 7, 2001

(54) METHOD OF MAKING SEMICONDUCTOR CHIP PACKAGE

(75) Inventors: Chun-Chi Lee, Kaohsiung; Kao-Yu Hsu, Kaohsiung Hsien, both of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/443,361

(22) Filed: Nov. 19, 1999

(51) Int. Cl.[7] .......................... H01L 21/44; H01L 21/48; H01L 21/50
(52) U.S. Cl. ............................................. 438/106; 438/127
(58) Field of Search ...................................... 438/106, 127

(56) References Cited

U.S. PATENT DOCUMENTS 5,897,337 * 4/1999 Kata et al. .
6,117,706 * 9/2000 Yoshioka et al. .

FOREIGN PATENT DOCUMENTS

348306 * 11/1985 (CN) .

* cited by examiner

Primary Examiner—John F. Niebling
Assistant Examiner—Josetta I. Jones

(57) ABSTRACT

A method of making a semiconductor chip package is characterized in that it utilizes a flexible film carrier (instead of conventional lead frame or substrate) to support a semiconductor chip during the assembly process. The method comprises the steps of: forming a plurality of through-holes in a flexible film carrier; laminating a metal layer on the lower surface of the flexible film carrier; etching the metal layer to form a plurality of connection pads corresponding to the through-holes; forming a metal coating on the surfaces of the connection pads which are not covered by the flexible film carrier; attaching a semiconductor chip to the upper surface of the flexible film carrier; electrically coupling bonding pads on the semiconductor chip to the connection pads; forming a package body over the upper surface of the flexible film carrier and the semiconductor chip.

7 Claims, 3 Drawing Sheets

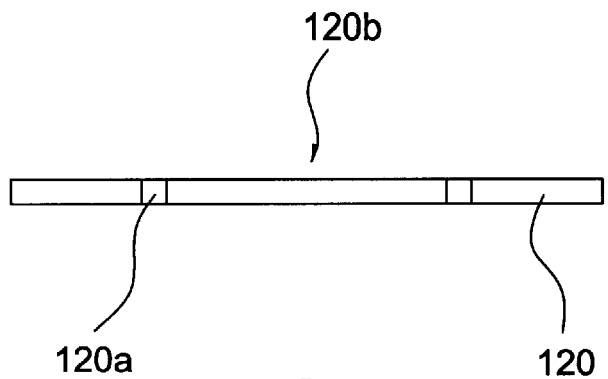
FIG. 3
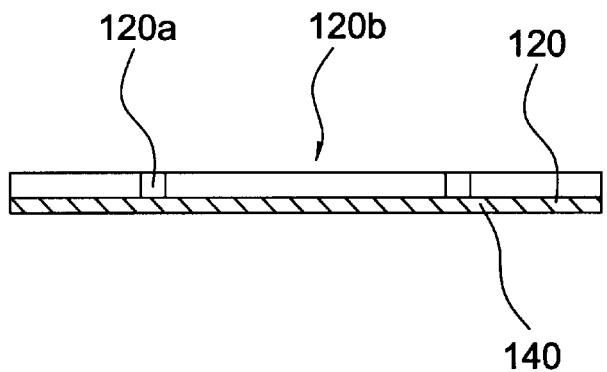
FIG. 4
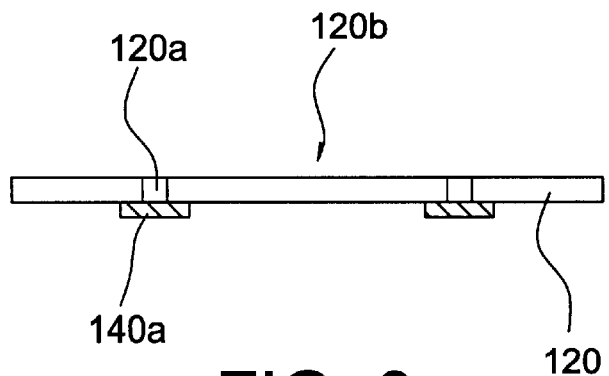
FIG. 5
FIG. 6

METHOD OF MAKING SEMICONDUCTOR CHIP PACKAGE

BACKGROUND OF THE INVENTION

1. Field of the Invention

This invention relates to semiconductor chip packages and a method of making such semiconductor chip packages.

2. Description of the Related Art

FIG. 1 is a semiconductor chip package 10 according to a preferred embodiment disclosed in R. O. C. Publication No. 348306 entitled "Device Having Resin Package And Method Of Producing The Same". The semiconductor chip package 10 includes a chip 110 securely attached to a resin insulating layer 122. The chip 110 has a plurality of bonding pads 110a used to electrically access the inner circuits thereof. The resin insulating layer 122 has a plurality of through-holes 122a disposed around the semiconductor chip 110. The lower surface of the resin insulating layer 122 is provided with a plurality of connection pads 140a. The bonding pads 110a of the chip 110 are connected to the connection pads 140a by a plurality of bonding wires 130. The semiconductor chip 110, the upper surface of the resin insulating layer 122 and the bonding wires 130 are encapsulated by a package body 150. The semiconductor chip package 100 can be mounted to a substrate, such as a printed circuit board, like other leadless devices.

R. O. C. Publication No. 348306 also discloses a method of producing the semiconductor chip package 10. The method mainly utilizes a metallic frame 170 (as shown in FIG. 2) to produce a plurality of the chip packages 10 simultaneously. The method includes: (A) forming a photoresist layer over the metallic frame 170, transferring the desired pattern, and developing in a manner that areas on the metallic frame 170 corresponding to the connection pads 140a are not covered by the photoresist layer; (B) electroplating areas on the metallic frame 170 which are not covered by the photoresist layer with a layer of metal such as gold or platinum thereby forming the plurality of connection pads 140a; (C) removing the photoresist layer; (D) forming a resin insulating layer 122 over the metallic frame 170 and the connection pads 140a; (E) forming a plurality of through-holes 122a in the resin insulating layer 122 at locations corresponding to the connection pads 140a; (F) securely attaching the backside surface of the chip 110 to the metallic frame 170 using an adhesive layer; (G) electrically coupling the bonding pads 110a of the chip 110 to the corresponding connection pads 140a; (H) forming a package body 120 over the chip 110. Finally, a separation process is taken to remove the metallic frame 170. As shown in FIG. 2, the separation process typically is done by utilizing an etching agent to selectively dissolve the metallic frame 170, with the connection pads 140a undissolved.

The method of making the semiconductor chip package 10 described above utilizes the metallic frame 170 to support the chip 110 during the assembly process, and then the metallic frame 170 needs to be removed by etching agent. Therefore, the method is quite complicated, expensive and time-consuming.

SUMMARY OF THE INVENTION

It is a primary object of the present invention to provide a method of making a semiconductor chip package which utilizes a flexible film carrier to support a semiconductor chip thereby simplifying the assembly process and cutting down the cost.

A method of making a semiconductor chip package in accordance with the present invention comprises the steps of: forming a plurality of through-holes in a flexible film carrier; laminating a metal layer on the lower surface of the flexible film carrier; etching the metal layer to form a plurality of connection pads, each connection pad has a portion exposed within the corresponding through-hole; forming a metal coating on the surfaces of the connection pads which are not covered by the flexible film carrier; attaching a semiconductor chip to a die receiving area on the upper surface of the flexible film carrier; electrically coupling bonding pads on the semiconductor chip to the front surfaces of the connection pads; forming a package body over the upper surface of the flexible film carrier and the semiconductor chip.

Since the method of making a semiconductor chip package in accordance with the present invention utilizes a flexible film carrier to support a semiconductor chip during the assembly process and the flexible film carrier can be directly removed, the method becomes simplified, cost-saving and time-saving.

BRIEF DESCRIPTION OF THE DRAWINGS

Other objects, advantages, and novel features of the invention will become more apparent from the following detailed description when taken in conjunction with the accompanying drawings.

FIGS. 3–8 illustrate a method of making a semiconductor chip package in accordance with the present invention.

DETAILED DESCRIPTION OF THE PREFERRED EMBODIMENT

Figure 9:
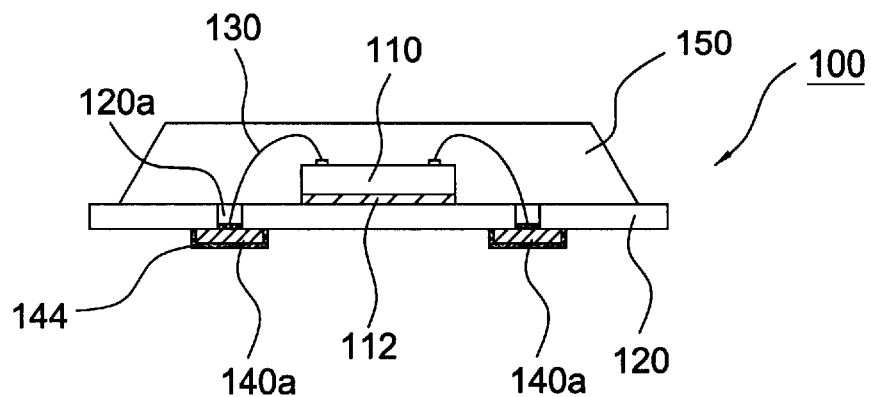
FIG. 9 is a cross-sectional view of a semiconductor chip package in accordance with the present invention.

FIG. 9 discloses a semiconductor chip package 100 formed in accordance with the present invention comprising a chip 110 securely attached to the upper surface of a flexible film carrier 120 through an adhesive layer. The chip 110 has a plurality of bonding pads 110a used to electrically access the inner circuits thereof. The flexible film carrier 120 has a plurality of through-holes 120a disposed around the semiconductor chip 110. The lower surface of the flexible film carrier 120 is provided with a plurality of connection pads 140a. The front surface of each connection pad 140a has a portion exposed within the corresponding through-hole 120a. The surfaces of the connection pads 140a which are not covered by the flexible film carrier have a metal coating 144 formed thereon. The bonding pads 110a of the chip 110 are connected to the connection pads 140a by a plurality of bonding wires 130 wherein the metal coating is used to improve adhesion between the bonding wires 130 and the connection pads. The semiconductor chip 110, the upper surface of the flexible film carrier 120 and the bonding wires 130 are encapsulated by a package body 150.

The chip package 100 can be mounted onto a substrate, such as a circuit board, like other leadless devices. For example, a PC board is screen printed with a solder paste in a pattern which corresponds to the pattern of the connection pads 140a exposed on the bottom surface of the semiconductor chip package 100. The package 100 is then appropriately positioned on the PC board and the solder is reflowed. It should be understood that the connection pads 140a on the bottom surface of the semiconductor chip package 100 can be printed with solder paste which is then reflowed to form solder balls and finally mounted onto a substrate.

FIGS. 3–8 show a method of making the semiconductor chip package 100 in accordance with the present invention.

FIG. 3 illustrates the flexible film carrier 120 which may be a resin film. Preferably, the flexible film carrier is made of polyimide such that the flexible film carrier is given properties that allow it to pass reliability tests.

Referring to FIG. 4, a plurality of through-holes 120a are formed in the flexible film carrier 120 by conventional punching technique. The central area on the flexible film carrier 120, which is surrounded by the through-holes 120a, is defined as the die receiving area 120b.

Referring to FIG. 5, the metal layer 140 such as copper foil is laminated on the flexible film carrier 120 by conventional methods such as thermocompression.

Referring to FIG. 6, the connection pads 140a are formed via photolithography and etching which comprise the steps of: (A) applying a photoresist layer on the surface of the metal layer 140; (B) pattern transferring by photolithography; (C) removing the unprotected portions of the metal layer to form the corresponding connection pads 140a by etching; and (D) removing the remaining photoresist layer.

Figure 1:
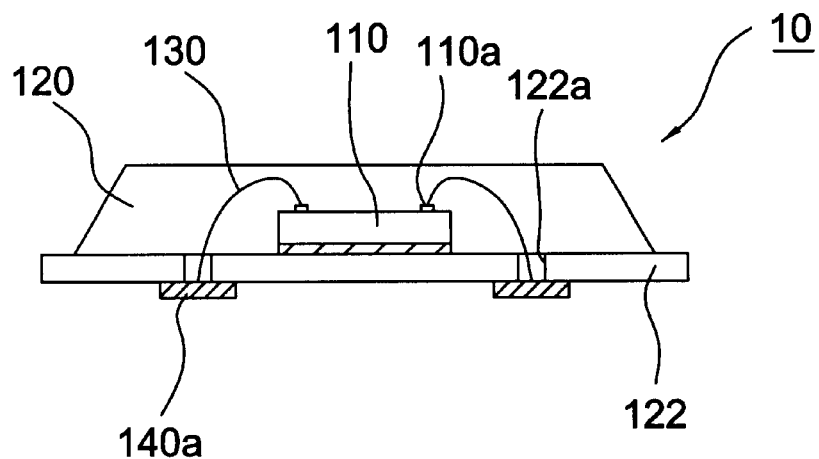
FIG. 1 is a cross-sectional view of a semiconductor chip package according to a preferred embodiment disclosed in R. O. C. Publication No. 348306 entitled "Device Having Resin Package And Method Of Producing The Same"
Figure 2:
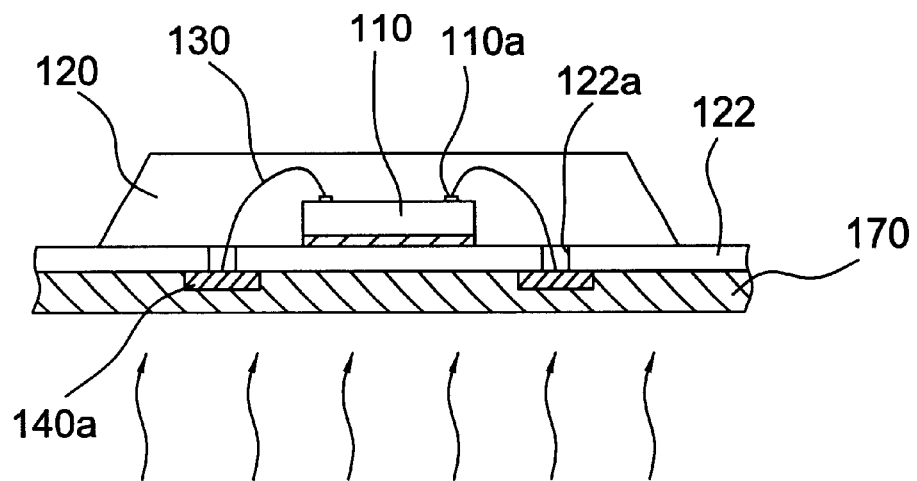
FIG. 2 is a cross-sectional view of a separation process in the method of producing the semiconductor chip package of FIG. 1.
Figure 7:
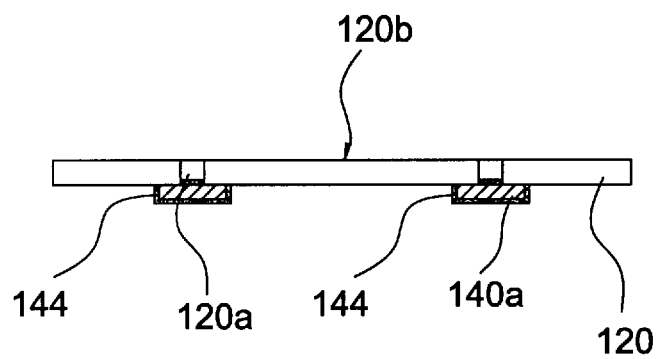

Referring to FIG. 7, the metal coating 144 is formed on the surfaces of the connection pads 140a which are not covered by the flexible film carrier 120. The metal coating 144 can be plated on the surfaces of the connection pads 140a by using conventional techniques. For example, a layer of nickel is plated thereon and then a layer of gold is plated on the nickel layer. Since the metal coating 144 is also formed on the connection pads 140a adapted for electrical connecting to the chip 110, the metal coating 144 should be formed of materials that allow a good bond to the conventional bonding wire material.

Figure 8:
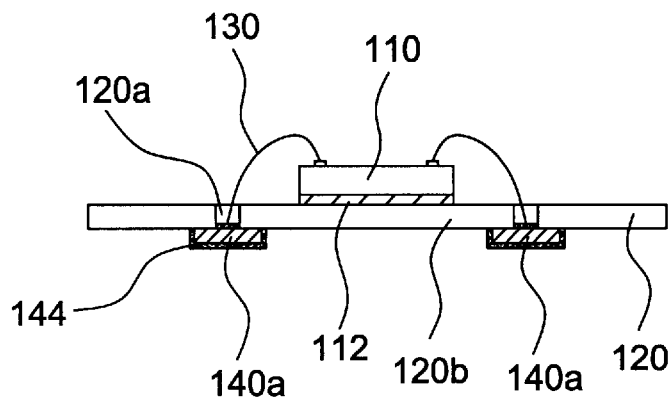

Referring to FIG. 8, the backside surface of the chip 110 is securely attached to the die receiving area 120b on the flexible film carrier 120 surrounded by the through-holes 120a through an adhesive layer 112 such as silver paste. The bonding wires 130 are connected to the bonding pads 110a on the chip 110 and the connection pads 140a using known wire bonding techniques.

Referring to FIG. 9, the package body 150 is formed over the upper surface of the flexible film carrier 120 and the semiconductor chip 110 using known plastic molding methods such as transfer molding, thereby obtaining the semiconductor chip package 100.

The method of making a semiconductor chip package in accordance with the present invention utilizes a flexible film carrier to carry a semiconductor chip during the assembly process; hence, the separation process employed in R. O. C. Publication No. 348306 is omitted. On the contrary, the method disclosed in R. O. C. Publication No. 348306 mainly utilizes the metallic frame to produce a plurality of semiconductor chip packages simultaneously; hence, the separation process for selectively dissolving the metallic frame by utilizing an etching agent is necessary. Therefore, the method in accordance with the present invention is more simplified, cost-saving and time-saving than that of R. O. C. Publication No. 348306.

Although the invention has been explained in relation to its preferred embodiment, it is to be understood that many other possible modifications and variations can be made without departing from the spirit and scope of the invention as hereinafter claimed.

What is claimed is:

1. A method of making a semiconductor chip package comprising the steps of:

providing a flexible film carrier having opposing upper and lower surfaces, the upper surface of the flexible film carrier having a die receiving area;

forming a plurality of through-holes in the flexible film carrier, the through-holes being disposed around the die receiving area;

laminating a metal layer on the lower surface of the flexible film carrier;

etching the metal layer to form a plurality of connection pads having opposing front and backside surfaces, the front surface of each connection pad has a portion exposed within the corresponding through-hole;

forming a metal coating on the surfaces of the connection pads which are not covered by the flexible film carrier;

attaching a semiconductor chip to the die receiving area of the flexible film carrier, the semiconductor chip having a plurality of bonding pads;

electrically coupling the bonding pads of the semiconductor chip to the front surfaces of the connection pads;

forming a package body over the upper surface of the flexible film carrier and the semiconductor chip.

2. The method as claimed in claim 1, further comprising the step of printing solder paste on the backside surfaces of the connection pads exposed on the bottom of the package body.

3. The method as claimed in claim 1, wherein the metal layer is a copper foil.

4. The method as claimed in claim 1, wherein the metal coating comprises a layer of nickel covering the surfaces of the connection pads which are not covered by the flexible film carrier, and a layer of gold covering the nickel layer.

5. The method as claimed in claim 1, wherein the flexible film carrier is a resin film.

6. The method as claimed in claim 1, wherein the flexible film carrier is made of polyimide.

7. The method as claimed in claim 1, wherein the step of electrically coupling comprises a wire bonding the bonding pads of the semiconductor chip to the front surfaces of the connection pads.

\* \* \* \* \*